United States Patent
Braunstorfinger et al.

(10) Patent No.: US 9,377,488 B2
(45) Date of Patent: Jun. 28, 2016

(54) SIMPLE GENERATION OF A REMOTE-CONTROL SEQUENCE FOR MEASURING DEVICES

(75) Inventors: Thomas Braunstorfinger, Munich (DE); Joachim Danz, Ottobrunn (DE)

(73) Assignee: RHODE & SCHWARZ GMBH & CO. KG, Munich (DE)

( * ) Notice: Subject to any disclaimer, the term of this patent is extended or adjusted under 35 U.S.C. 154(b) by 812 days.

(21) Appl. No.: 13/359,794

(22) Filed: Jan. 27, 2012

(65) Prior Publication Data

US 2012/0197572 A1    Aug. 2, 2012

(30) Foreign Application Priority Data

Jan. 27, 2011    (DE) .......................... 10 2011 009 583

(51) Int. Cl.
*G01R 13/02*    (2006.01)
*G01R 1/02*    (2006.01)

(52) U.S. Cl.
CPC .............. *G01R 13/029* (2013.01); *G01R 1/025* (2013.01)

(58) Field of Classification Search
CPC ........... H04N 2201/0046; G06F 9/445; G01R 13/029; G01R 1/025
USPC ........... 702/87, 57, 60, 64–68, 70–71, 75, 79, 702/81, 84–85, 106–108, 123, 127, 182, 702/189; 700/1, 6, 11, 17, 32–33, 52, 700/75–76, 83, 108–109; 714/724, 735; 348/725, 731
See application file for complete search history.

(56) References Cited

U.S. PATENT DOCUMENTS

| 3,629,845 | A | * | 12/1971 | Chisholm et al. ........ 340/870.13 |
| 5,719,761 | A | | 2/1998 | Gatti et al. |
| 7,783,790 | B2 | | 8/2010 | Meyer et al. |
| 2004/0070685 | A1 | * | 4/2004 | Kondo et al. ................. 348/441 |
| 2004/0246001 | A1 | | 12/2004 | Sontag et al. |

FOREIGN PATENT DOCUMENTS

DE    2 107 952        8/1972
DE    10 2008 055 192 A1    7/2010

* cited by examiner

*Primary Examiner* — Toan Le
(74) *Attorney, Agent, or Firm* — Ditthavong & Steiner, P.A.

(57) ABSTRACT

A measuring device provides a central data-processing unit, a control unit and at least one memory unit. The control unit and the at least one memory unit are connected to the central data-processing unit. At a given time, the control unit compares the adjustable parameters of the measuring device with parameters for a basic setting of the measuring device and generates control commands for the adjustment of the deviating parameters, or the control unit registers the parameter changes from a given time and generates control commands from these in order to adjust the changed parameters.

16 Claims, 4 Drawing Sheets

```
*RST
SEQUENCE START
POW 10
FREQ 1.34 GHZ
SOUR:BB:GRAP:STAT ON
```

Fig. 3A

```
void MyClass::DoTestSequence(void)
{
    CString sCommand;
    ViUInt32 retCount;

sCommand = "*RST";
    sCommand += '\n';
    viWrite(instr, (ViBuf)(const char*) sCommand,
            sCommand.GetLength(), &retCount);

sCommand = "SEQUENCE START";
    sCommand += '\n';
    viWrite(instr, (ViBuf)(const char*) sCommand,
            sCommand.GetLength(), &retCount);

sCommand = "POW 10";
    sCommand += '\n';
    viWrite(instr, (ViBuf)(const char*) sCommand,
            sCommand.GetLength(), &retCount);

sCommand = "FREQ 1.34 GHZ";
    sCommand += '\n';
    viWrite(instr, (ViBuf)(const char*) sCommand,
            sCommand.GetLength(), &retCount);

sCommand = "SOUR:BB:GRAP:STAT ON";
    sCommand += '\n';
    viWrite(instr, (ViBuf)(const char*) sCommand,
            sCommand.GetLength(), &retCount);
}
```

SIMPLE GENERATION OF A REMOTE-CONTROL SEQUENCE FOR MEASURING DEVICES

CROSS-REFERENCE TO RELATED APPLICATION

The present application claims priority to German Application No. 10 2011 009 583.7, filed on Jan. 27, 2011, the entire contents of which are herein incorporated by reference.

BACKGROUND OF THE INVENTION

1. Field of the Invention

The invention relates to a measuring device, wherein a control unit within this measuring device registers all of the settings of the measuring device and generates control commands with which the measuring device can be reset in exactly the same manner at a later time.

2. Discussion of the Background

The range of functions of measuring devices, such as signal generators, spectrum analyzers, network analyzers or oscilloscopes, increases constantly from one product generation to the next. However, the adjustment of such a measuring device for registering or generating a test signal often requires a considerable amount of time. The adjustment of these measuring devices can be implemented, on the one hand, locally, that is, by a user who interacts directly with the measuring device, but also in a remotely controlled manner by a computer system connected to the measuring device. To ensure that the same settings do not need to be activated again manually after every restart of the measuring device, it is desirable if the settings of the measuring device can be buffered in order to load them again at a later time as required.

A method and a device for displaying, adjusting and buffering program data for a control device are known from patent specification DE 2 107 952. The method and the device allow all of the settings of the control device to be buffered at any required time. Accordingly, the buffered settings for the control device can be re-loaded at a later time. The disadvantage with this method is that all of the settings must be buffered, which means that the necessary storage space increases considerably with complex measuring devices. Moreover, once a setting has been buffered, it cannot be changed again. On the contrary, the buffered setting must be loaded, the changes must be activated, and a new setting must be re-buffered. Especially if only one parameter is to be changed, this procedure is very time consuming.

SUMMARY OF THE INVENTION

Accordingly, embodiments of the measuring device according to the invention and of the method according to the invention for the operation of a measuring device provide a solution for buffering all settings for the measuring device in the most flexible manner possible with minimum costs in time and resources.

An embodiment of the measuring device according to the invention provides a central data-processing unit, a control unit and at least one memory unit, wherein the control unit and the at least one memory unit are connected to the central data-processing unit. At a given time, the control unit compares the adjustable parameters of the measuring device with parameters for a basic setting of the measuring device. Furthermore, the control unit generates corresponding control commands for adjusting the deviating parameters. It is also possible for the control unit to register all parameter changes from a given time and to generate control commands from these in order to adjust the changed parameters.

It is particularly advantageous if the control unit compares all adjustable parameters of the measuring device with parameters for a basic setting of the measuring device at a given time in order to generate control commands for the deviating parameters, with which these can be adjusted. The comparison with the parameters of a basic setting is particularly advantageous because, in most cases, only very few of the adjustable parameters are changed, so that the required memory space for the control commands is reduced if these are provided only for the deviating parameters. Moreover, the generation of these control commands is accomplished very quickly and precisely because all of the adjusted parameters for the measuring device need not be buffered.

The method according to the invention for operating a measuring device with a central data-processing unit, a control unit and at least one memory unit, wherein the control unit and the at least one memory unit are connected to the central data-processing unit, comprises several method steps. Initially, all of the adjusted parameters of the measuring device are compared by the control unit, on the one hand, with parameters for a basic setting of the measuring device in order to generate control commands for the adjustment of the deviating parameters at a later stage. It is also possible for all parameter changes to be initially registered by the control unit from a given time and for control commands to be generated from these in order to adjust the changed parameters.

It is particularly advantageous if all of the parameter changes are registered by the control unit from a given time and if control commands are generated by the control unit for the adjustment of the changed parameters. It is also advantageous if the corresponding control commands are generated by the control unit only for parameter changes, so that the required memory space is reduced by comparison with a complete buffering of all settings.

A further advantage of the measuring device according to embodiments of the invention is provided if the control unit registers only the last value for each parameter in the case of a parameter change, and generates a control command only to adjust this. Accordingly, the necessary memory space or the time required for generating the control commands can be further reduced.

Additionally, with the measuring device according to embodiments of the invention, it is advantageous if the control unit takes parameter dependencies into consideration in the generation of the control commands and/or if the control unit buffers the control commands in chronological order. The consideration of parameter dependencies by the control unit is especially important if the measuring device is subsequently to be reset into the required condition by means of the control commands. Similarly, it is important for the control commands to be buffered in chronological order, for example, to ensure that the output of a signal generator is only activated when the value for the level of the signal to be output has been set.

Moreover, with the measuring device according to the invention it is advantageous if the control unit buffers the control commands in the at least one memory unit and/or if the control unit displays the control commands on a visual-display unit connected to the measuring device and/or if the control unit communicates the control commands to a computer system connected to the measuring device.

The buffering of the control commands in the at least one memory unit, or the communication of the control commands to a computer system connected to the measuring device is especially advantageous because the control commands can then be further processed. The display of the control commands on a connected visual-display unit is also advantageous because this avoids the troublesome need for a user to look up the control commands in the operating manual.

Finally, with the measuring device according to embodiments of the invention, it is advantageous if the generated control commands are buffered as plain text and/or if the generated control commands can be transmitted to the measuring device through SCPI (English: standard commands for programmable instruments; German: standardisierter Befehlsatz für programmierbare Messgeräte) via LAN (English: local area network; German: lokales Netzwerk) and/or via USB (English: universal serial bus; German: universeller serieller Bus) and/or via CAN (English: controller area network; German: bereichskontrolliertes Netzwerk), so that the measuring device can be controlled remotely. Since the control commands are buffered as plain text, these can be adapted particularly readily for subsequent preparation of remote-control sequences. Moreover, the transmission of the generated control commands to the measuring device through SCPI allows the latter to be controlled remotely in a very simple manner.

One further advantage of the method according to embodiments of the invention for the operation of the measuring device is provided if the generated control commands and/or a basic setting for the measuring device can be loaded by the control unit from the at least one memory unit, and/or if the generated control commands and/or a basic setting for the measuring device can be loaded from a computer system connected to the measuring device by the control unit and/or into the control unit, and if the generated control commands can be implemented by the control unit. This means that the measuring device can be reset as it was adjusted when the control commands were generated.

Finally, with the method according to embodiments of the invention for operating a measuring device, it is advantageous if a testing of the validity of the control commands is omitted during the implementation of the previously generated control commands by the control unit. Omitting such a testing means that the order in which the control commands are sent to the measuring device is not significant. Accordingly, the measuring device can be set as required without the appearance of any warnings.

BRIEF DESCRIPTION OF THE DRAWINGS

Various exemplary embodiments of the invention are described by way of example below with reference to the drawings. Identical subject matters provide the same reference markings. The corresponding figures in the drawings are as follows.

DETAILED DESCRIPTION OF EXEMPLARY EMBODIMENTS OF THE INVENTION

Figure 1:
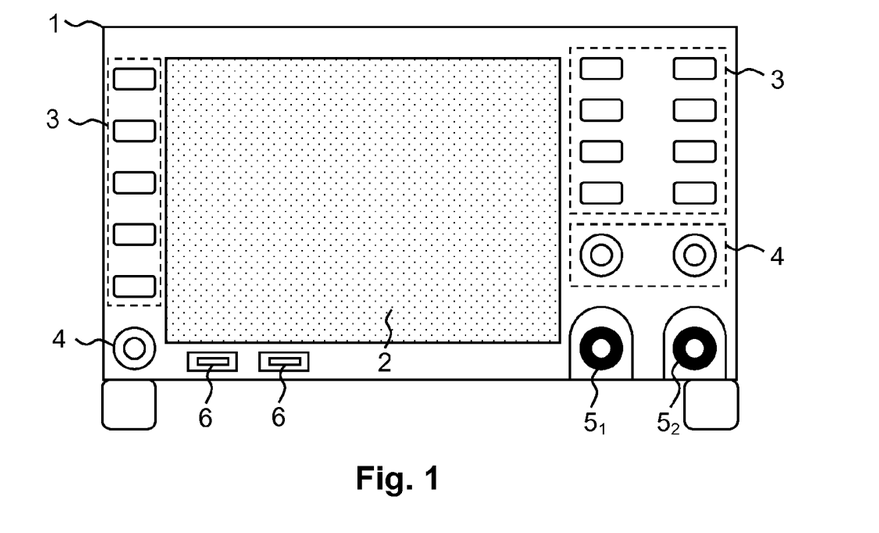
FIG. 1 shows an exemplary embodiment of a measuring device according to the invention.

FIG. 1 shows an exemplary embodiment of a measuring device 1 according to the invention. The measuring device 1 provides a touch screen 2, which can have, for example, a resistive, and/or capacitive and/or inductive function, wherein other types of touch screen 2 can also be used for the measuring device 1. It is also possible to use a normal screen 2 without a touch-sensitive element.

Moreover, the illustrated measuring device 1 provides several keys 3 and rotary knobs 4. These can be illuminated, for example, with different colors and allow the user to implement basic settings of the measuring device as quickly and directly as possible.

The measuring device 1 also provides the input terminals and/or output terminals $5_1$, $5_2$, which are used to supply one or more test signals to the electronic tester 11 which is not illustrated, or to output signals which are generated by the electronic tester 11, which is not illustrated. Furthermore, the measuring device 1 also provides terminals in order to connect additional peripheral devices. These terminals can be, for example, USB terminals 6. Similarly, the measuring device 1 can also provide LAN terminals 10, CAN terminals 12 or GPIB terminals (English: general purpose interface bus; German: Schnittstellen-Bus für grundlegende Zwecke). The measuring device 1 itself can be, for example, a spectrum analyzer, a network analyzer, a signal generator, an oscilloscope or a mobile radio tester. In general, the measuring device 1 is a device with which various signals can be analyzed and/or with which various signals can be generated.

A closer consideration of FIG. 1 shows that the measuring device 1 can be adjusted in a very varied manner by means of the keys 3 and knobs 4. To ensure that a user can analyze a special signal as accurately as possible, extensive settings of the measuring device 1 are often required. For example, if the measuring device 1 is an oscilloscope, the user must select a voltage range and time range which corresponds approximately to that of the expected test signal. At the same time, the trigger behaviour (German: Auslöseverhalten) of a trigger unit not illustrated in FIG. 1 can be tuned to the signal to be measured. In addition to the selection of an appropriate input terminal $5_1$, $5_2$, many further basic settings must also be implemented before a test signal can be analyzed with the measuring device 1. It is therefore desirable for a user to be able to store the settings for the measuring device 1 once they have been activated, so that the same test signal or a similar test signal can be analyzed as quickly as possible in future. Similarly, it is necessary for settings buffered on one measuring device 1 also to be able to be transmitted to other measuring devices 1 of the same type. This is particularly necessary in the case of production tests, in which a plurality of measuring devices 1, for example, mobile radio testers, is used.

Figure 2:
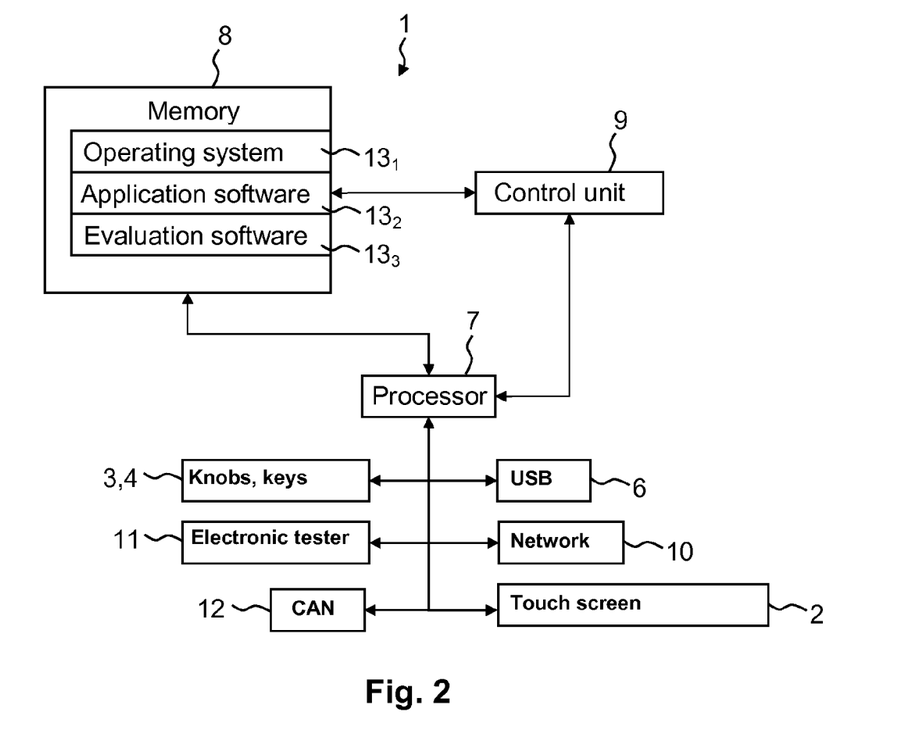
FIG. 2 shows an exemplary embodiment of a block-circuit diagram of the measuring device according to the invention.

FIG. 2 shows an exemplary embodiment of a block-circuit diagram, which describes the measuring device 1 according to the invention in greater detail. The measuring device 1 according to the invention provides a central data-processing unit 7, a control unit 9 and at least one memory unit 8. The control unit 9 and the at least one memory unit 8 in this context are connected to the central data-processing unit 7. The central data-processing unit 7 can be, for example, one or more processors, digital signal processors or FPGAS (English: field programmable gate array; German: im (Anwendungs-) Feld programmierbare (Logik-) Gatter-Anordnung). The at least one memory unit 8 can be a hard-disk memory and/or RAM memory, which is installed in the measuring device 1 or in an arrangement connected to the measuring device 1, or in a computer system connected to the measuring device 1. The at least one memory unit 8 is connected via conventional interfaces to the central data-processing unit 7, which can be found, for example, in the X86-processor architecture.

The data for the operating system 13₁, the application software 13₂ and the evaluation software 13₃ are disposed in the at least one memory unit 8. The application software 13₂ in this context interacts directly with the electronic tester 11. The control unit 9 can provide its own central data-processing unit and its own memory unit, or it can be formed within the at least one memory unit 8 and use the central data-processing unit 7. Accordingly, the control unit 9 has access to the at least one memory unit 8 and, via the central data-processing unit 7, to the peripheral devices connected to the central data-processing unit 7.

Alongside the at least one memory unit 8 and the control unit 9, a plurality of further peripheral devices are also connected to the central data-processing unit 7. Keys 3 and rotary knobs 4, which are necessary for operating the measuring device 1, are also connected to the central data-processing unit 7, as is the actual electronic tester 11 of the measuring device 1. In this context, the electronic tester 11 is preferably connected to the central data-processing unit 7 via interfaces such as PCI (English: peripheral component interconnect; German: dezentrale Bauteileverbindung), or PCIe (English: PCI-express, German: PCI-Express). The keys 3 and rotary knobs 4 can be connected to the central data-processing unit 7 via a USB connection or via a serial connection. However, the keys 3 and rotary knobs 4 can also be connected directly to the associated electronic tester 11. For example, the keys 3 can be connected directly to the corresponding terminal pins of an FPGA formed within the electronic tester 11.

Furthermore, one or more USB terminals 6 and/or network terminals 10 are preferably connected to the central data-processing unit 7. The at least one USB terminal 6 allows, for example, external memory units to be connected to the measuring device 1 by means of the former. Memory units can also be connected to the measuring device 1 via the at least one network terminal 10. Additionally, a CAN terminal 12 can be connected to the central data-processing unit 7. The CAN terminal 12 and also the at least one USB terminal 6 and the at least one network terminal 10 can also be used to connect the measuring device 1 to a superordinate computer system. The superordinate computer system can control the measuring device 1 remotely with control commands via this connection.

Furthermore, a touch screen 2 or a normal screen 2 can be connected to the central data-processing unit 7. The visual-display unit 2 is preferably connected to the central data-processing unit 7 via interfaces such as DVI (English: digital visual interface; German: digitale visuelle Schnittstelle) or DisplayPort (German: Bildschirmanschluss).

In the following section, the method of functioning of the control unit 9 according to the invention is described in greater detail. Several goals can be achieved with the control unit 9 according to the invention. A first goal can be seen in that all of the settings of the measuring device can be buffered by the control unit 9, wherein this buffering procedure should take place as rapidly as possible and, in this context, should occupy as little storage space as possible in the at least one memory unit 8. Accordingly, it should be possible for the control unit 9 to re-load the buffered settings at any required time. A further goal is that the control unit 9 buffers the adjusted parameters of the measuring device 1 in such a manner that these can be changed at any time without difficulty. If the measuring device 1 is an oscilloscope, the adjusted parameters can be information regarding how the at least one input terminal 5₁, 5₂ is set, or how the trigger unit is configured, or which values are selected for the voltage range and the time range.

The control unit 9 according to the invention can achieve these goals using two different options. In a first preferred option, the control unit 9 registers the adjusted parameters of the measuring device 1 at a given time and compares these with the parameters for a basic setting of the measuring device 1. Such a basic setting is preferably the setting of the measuring device 1 which is loaded at the startup of the measuring device 1 and is known. The adjusted parameters for this basic setting are preferably selected in such a manner that they correspond to the measuring requirements of most users. For example, if the measuring device 1 is an oscilloscope, it can be specified in the adjustment parameters for the basic setting that all input terminals 5₁, 5₂ are terminated with a resistance of 1 MOhm, and that the signal to be measured corresponds to a voltage. The basic setting itself is stored in the at least one memory unit 8 and can also be modified if required.

A comparison of the adjusted parameters of the measuring device 1 with the parameters of a basic setting of the measuring device 1 means that a corresponding control command need not be generated for every adjusted parameter of the measuring device 1, thereby minimizing the necessary memory requirement. Furthermore, the control unit 9 generates the corresponding control commands only for the deviating parameters, so that only deviating parameters can be adjusted by means of the control commands at a later time. Experiments have shown that the overwhelming majority of adjustable parameters ultimately do not differ from the parameters of a skilfully selected basic setting. For example, in most measuring devices 1, it is possible to allocate a different color to every input signal. However, a user seldom makes use of this to modify the color selection defined in the basic setting for the corresponding test channel, so that the control unit need not generate a separate control command for this purpose. With the first option, it is particularly advantageous that the corresponding control commands can be generated by the control unit 9 at any time for the adjusted parameters of the measuring device 1, which are then used to reset the adjustable parameters of the measuring device 1 at a later time in exactly the same manner as at the time when the control commands were generated by the control unit 9.

With the second option, the control unit 9 registers all of the parameter changes for the measuring device 1 from a given time and generates corresponding control commands for the modified parameters so that the modified parameters can be reset at a later time. With the second option, it is particularly advantageous if the control commands are generated in exactly the same sequence as that in which the parameter changes take place. This preserves the original sequence.

However, by comparison with the prior art, both options provide the advantage that exclusively control commands which are used for subsequent adjustment of the measuring device are generated by the control unit 9, and that no image (English: image), which is associated with a much greater memory requirement, is provided for the measuring device 1. Moreover, such an image cannot be modified at a subsequent stage. On the contrary, the buffered image would have to be loaded in order to adjust the required parameter change, wherein a new image would then have to be provided, which consumes a considerable amount of time and memory space. Since the control unit 9 according to the invention generates only control commands, subsequent parameter changes can be realized very readily. For this purpose, the control commands need to be changed only slightly, or new control commands only need to be inserted between the existing control commands.

Furthermore, with the second option, the control unit 9 registers only the last value for every parameter in the case of a parameter change and generates a control command for this only in order to adjust it. For instance, if the measuring device 1 according to the invention is an oscilloscope, in the event of a parameter change to adjust the time range, only a control command which contains, for example, the information that one division corresponds to 100 ns, is generated. If the time range is modified stepwise up to the named value, only one control command is generated according to the invention for the adjustment of precisely this value, which leads to a further reduction of the necessary memory requirement.

Furthermore, the control unit 9 according to the invention of the measuring device 1 can take parameter dependencies into consideration in generating the control commands. For this purpose, given control commands can be linked with other control commands in order to ensure that all of these are implemented. For example, if a control command for the activation of the trigger unit is generated on a given measuring channel, a second control command which displays the corresponding measuring channel on the visual-display unit 2 is generated automatically. The control unit 9 also comprises an intelligent conversion of the individual control commands. With the first option, the control commands are generated only for the deviating parameters, wherein no sequence is specified according to which the control commands are buffered in the at least one memory unit 8 or according to which the control commands are either output to a computer system connected to the measuring device 1, or buffered there.

However, given control commands in the last position are automatically buffered by the control unit 9 or output in the last position to the computer system connected to the measuring device 1. For example, if the measuring device 1 is a signal generator, all control commands which are used for adjusting the signal generator are first buffered or transferred to the computer system, before the control command for the activation of the signal output is generated and buffered or transferred. This ensures that the signal to be output has precisely the required shape and amplitude, and a device connected to the signal output will not be damaged.

Furthermore, the control unit 9 according to the invention can generate the control commands in chronological order. Especially with the second option, according to which the control commands are generated for all parameter changes from a given time, such a chronological order is meaningful because this guarantees that, during the processing of the control commands at a later time, the measuring device is set in exactly the same manner as at the time at which the control commands were generated.

Moreover, it is possible for the at least one control unit 9 to buffer the generated control commands in the at least one memory unit 8. The control unit 9 can also transmit the generated control commands to a computer system connected to the measuring device 1 or buffer them in the associated memory unit. The computer system in this context can be connected, for example, to the USB terminal 6 and/or to the network terminal 10 and/or to the CAN terminal 12. Additionally, it is possible for the control unit 9 to display the control commands on a visual-display unit 2 connected to the measuring device 1. This is particularly relevant in the case of the second option, according to which the control unit 9 registers all parameter changes from a given time and generates a corresponding control command for every parameter change. This control command can then be displayed on the connected visual-display unit 2. This saves a user, for example, the effort of searching for the corresponding control commands in the operating manual. Because control commands are involved and not just general functional requests, the control commands also contain the corresponding parameters. Frequent errors, for example, when parameters which are inserted by a user into a general function exceed the permitted value range, can accordingly no longer occur.

At a later stage, the control unit 9 of the measuring device 1 can load the generated control commands and/or a basic setting for the measuring device from the at least one memory unit 8. The control unit 9 can also load the generated control commands and/or a basic setting for the measuring device 1 from a computer system connected to the measuring device 1. It is also possible for a computer system which is connected to the measuring device 1 to transmit the generated control commands to the control unit 9 in the measuring device 1. Following this, the control unit 9 implements the generated control commands. If the control unit 9 loads a basic setting for the measuring device 1 and then, for example, loads the control commands generated according to the first option, the measuring device 1 is adjusted in exactly the same manner as at the time when the control unit 9 generated the control commands. It is particularly advantageous that these control commands can also be loaded from a computer system connected to the measuring device or respectively can be transmitted from such a computer system to the control unit 9, so that the measuring device 1 can be controlled remotely.

It is also particularly advantageous that the control unit 9 does not implement a testing of the validity of the control commands during the implementation of the previously generated control commands. This is preferably achieved in that a special control command marks all subsequent control commands as valid. Moreover, this fact is not otherwise problematic, because a measuring device 1 with the previously generated control commands must have functioned in an error-free manner.

Furthermore, the control unit 9 buffers the generated control commands in the at least one memory unit 8 or respectively in a computer system connected to the measuring device 1 as plain text. This means that these can be revised by a user without difficulty. The control commands are preferably SCPI commands or VISA commands (English: virtual instrument software architecture; German: virtuelle Softwarearchitektur für Messeräte) which can be transmitted to the measuring device 1 via a LAN bus and/or via a USB bus and/or via a CAN bus, so that the measuring device 1 can be controlled remotely. It is also possible for the control commands to be functional requests which can be executed, for example, through LAB windows. Since the measuring device 1 is remotely controllable through SCPI commands or VISA commands, a very high degree of automation can be achieved. The control commands themselves can also be started from a program loop, so that the program code for the adjustment of the parameters for the measuring device 1 preserves a logical arrangement.

Finally, it should be stressed that it is particularly advantageous if the control unit 9 according to the invention of the measuring device 1 generates control commands to reset the adjusted parameters of the measuring device 1 at any required time and if the control commands are structured in such a manner that they can be transmitted to the measuring device 1 at any time through already existing programs. In this context, it is particularly helpful that the control unit 9 buffers the control commands either in the at least one memory unit 8 within the measuring device 1 or in a memory unit connected to the measuring device 1, so that these can be re-accessed at any time without difficulty in order to program the measuring device 1 or another identical measuring device. In this context, it is particularly advantageous that, within the control unit 9, it is possible to select whether the control commands are to be SCPI commands, VISA commands or direct LAB windows functional requests, so that the control unit 9 generates precisely this type of control command for the adjusted parameters of the measuring device 1, which the user wishes to process further within a user-prepared software program.

Figure 3A:
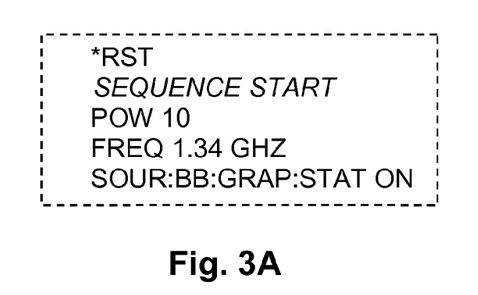
FIG. 3A shows an exemplary embodiment, which illustrates the generated control commands.

FIG. 3A shows an exemplary embodiment which displays the generated control commands. In this context, the control unit 9 according to the invention has compared the adjusted parameters of the measuring device 1 with the parameters for a basic setting of the measuring device 1 and generated the control commands shown in FIG. 3A for the deviating parameters. In this exemplary embodiment, the measuring device 1 is a signal generator. The control commands are SCPI commands, which, as shown in FIG. 3A, are generated as plain text. If these commands are transmitted in the sequence illustrated in FIG. 3A from a computer system connected to the measuring device 1 to the latter, the measuring device is reset in the manner in which it was adjusted when the control unit 9 according to the invention generated the set of control commands illustrated in FIG. 3A.

The first command (*RST) causes the measuring device 1 to load a basic setting. As soon as the basic setting has been loaded, the second command (SEQUENCE START) is optionally implemented. This command causes the following sequence of control commands to be marked as valid, so that the parameters transferred are not checked with regard to their validity. The next command (POW 10) indicates, for example, the output power of the signal generator. Following this, the command (FREQ 1.34 GHz) communicates to the signal generator that the signal to be generated should have a frequency of 1.34 GHz. Because it is not indicated whether the signal to be generated should be, for example, a sinusoidal signal or a square wave signal, it can be assumed that the signal shape to be generated in the basic setting should be retained. In a final command (SOUR:BB:GRAP:STAT ON), the signal generator is activated so that the signal to be generated appears at the output.

It can be seen clearly that the control unit 9 has also output the last command in the last position, so that the signal generator does not generate a signal with a frequency or power which is stored in the basic setting. Finally, a further control command (SEQUENCE STOP) can be transmitted to the measuring device 1, which states that all control commands, which are subsequently to be processed by the measuring device 1, should be checked with regard to their validity. This ensures, for example, that the maximum permitted signal power, which is transmitted retrospectively by a user from a computer system connected to the measuring device 1 to the latter, is not exceeded.

Figure 3B:
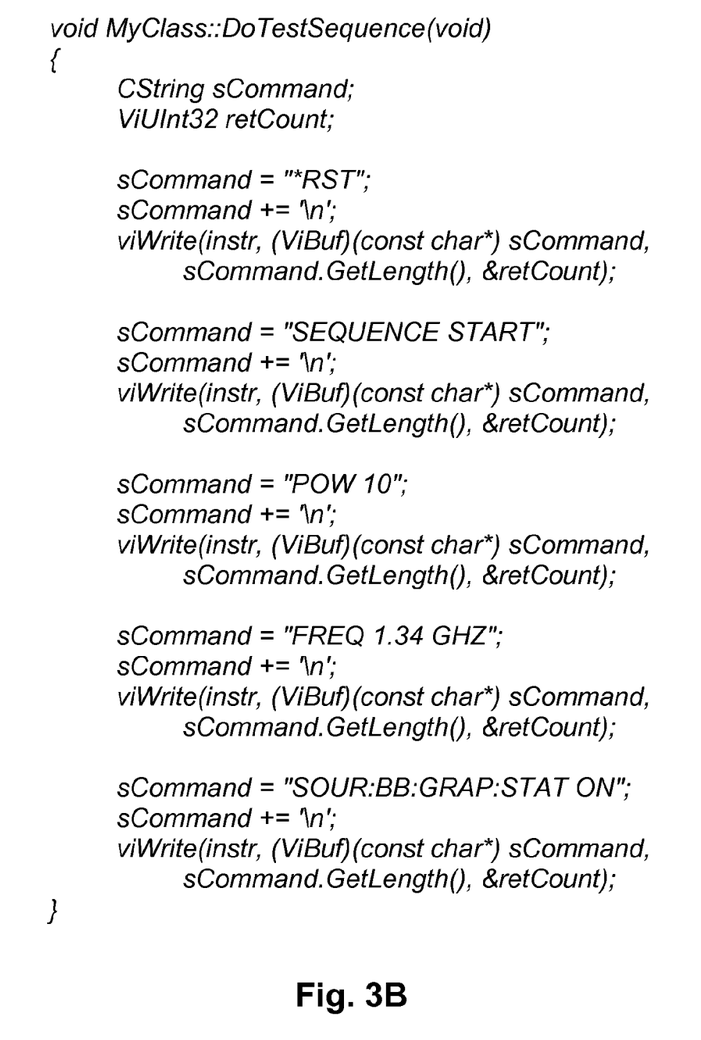
FIG. 3B shows a simplified program code, which illustrates how the control unit generates the control commands to be output.

FIG. 3B shows a simplified exemplary embodiment of program code, which defines how the control unit 9 according to the invention generates the control commands to be output. It can be seen clearly that the corresponding SCPI command is already stored as a string. Via the function "viWrite ( )", the corresponding control command is either buffered in the at least one memory unit 8 or transmitted to a computer system connected to the measuring device 1 or buffered there. During the implementation of the commands illustrated in FIG. 3B, the control commands illustrated in FIG. 3A are generated in plain text.

Figure 4A:
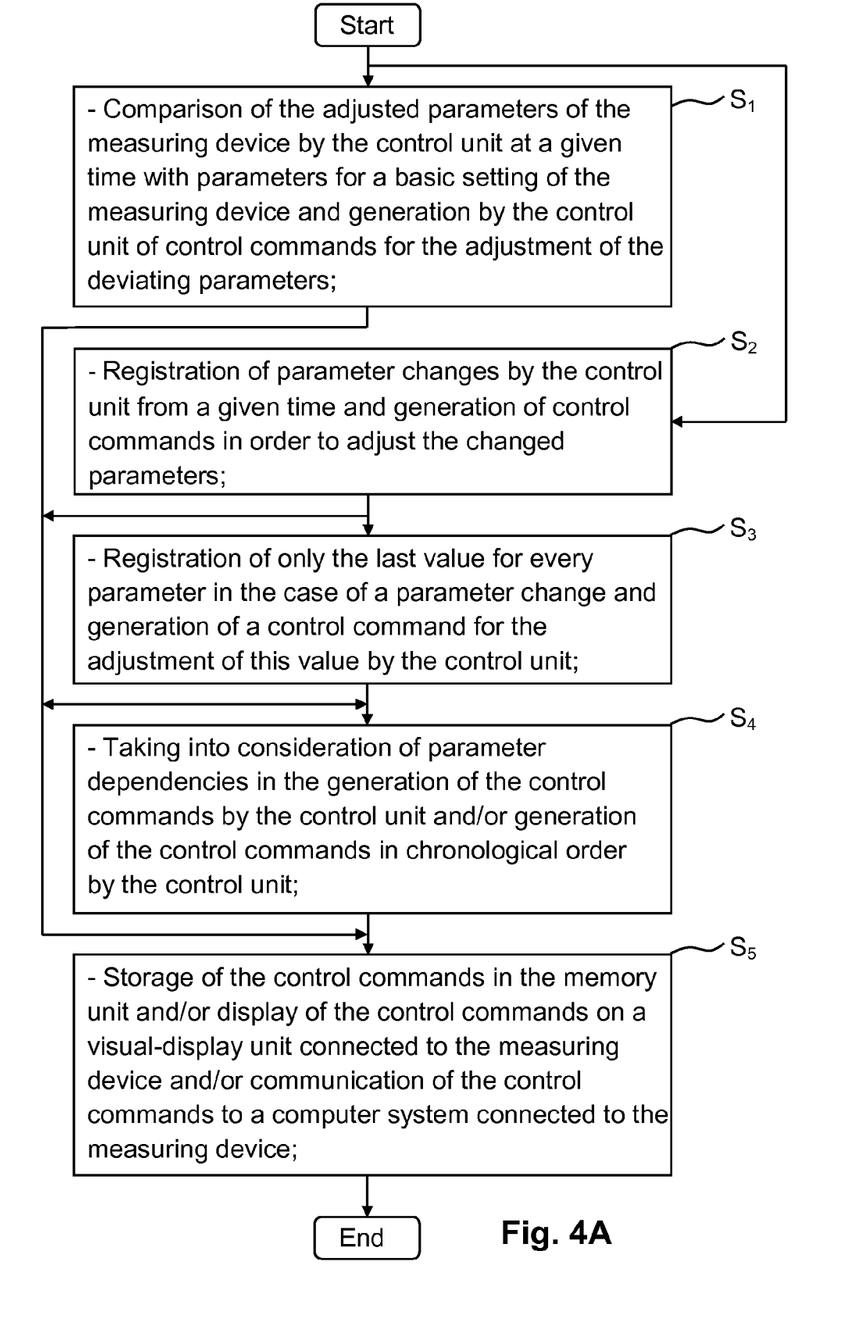
FIG. 4A shows an exemplary embodiment of a flowchart of the method according to the invention for operating a measuring device.

FIG. 4A shows an exemplary embodiment of a flowchart, which illustrates the method according to the invention for operating the measuring device 1. The measuring device 1 in this context provides a central data-processing unit 7, a control unit 9 and at least one memory unit 8, wherein the control unit 9 and the at least one memory unit 8 are connected to the central data-processing unit 7. The goal of the method for operating the measuring device 1 is that, once adjusted, the parameters of the measuring device 1 can be reloaded at any time. However, the minimum possible memory space in the at least one memory unit 8 should be occupied for this purpose, wherein, at the same time, it must be ensured that the parameters to be set for the measuring device 1 can also be changed as required at a later time. Two options are provided for the achievement of this goal.

In the first option, a method step $S_1$, in which the adjustable parameters of the measuring device 1 are compared by the control unit 9 with parameters for a known basic setting of the measuring device 1 at a given time, is implemented. Following this, control commands are generated for the deviating parameters so that the deviating parameters can be reset at a later time. These control commands are generated by the control unit 9. The time at which the adjustable parameters of the measuring device 1 are compared with those of a basic setting can be selected freely by a user. In this context, it is particularly advantageous that the measuring device 1 can be adjusted at a later time in exactly the same manner as at the time when the control unit 9 registered the adjustable parameters with those of a basic setting. Especially for developers who work for long periods with a measuring device 1, eventually obtaining their ideal signal, this advantage is very important because it means that this signal can be preserved and re-generated at any time for a subsequent automation of the measuring device 1.

Since the control unit 9 compares the adjustable parameters with the parameters for a basic setting, control commands need not be generated for all of the adjustable parameters of the measuring device 1, but only for those parameters which have changed relative to the parameters for the basic setting. Accordingly, the required memory space is reduced in a very efficient manner. Furthermore, a very good flexibility is achieved because the control unit 9 generates a control command for every deviating or respectively changed parameter. The parameters to be adjusted can be changed as required at a later stage by exchanging the corresponding control commands, which, especially in the case of the generation of a buffered image, would not be possible.

The second option for achieving the goal named above can be implemented by executing method step $S_2$. In method step $S_2$, parameter changes are registered by the control unit 9 from a given time, so that corresponding control commands can then be generated for the parameter changes, and the changed parameters can then be reset at a later time. Method step $S_2$ is implemented especially in order to generate control commands for given parameter changes. Accordingly, method step $S_2$ avoids the problem of the user having to look up the control commands in the technical documentation in order to change a parameter, and therefore allows the user to prepare programs for the control of the measuring device 1 in a very efficient manner. By preference, at the start of the method according to the invention for operating the measuring device 1, either method step $S_1$ or method step $S_2$ is implemented. However, both method steps $S_1$ and $S_2$ can also be implemented.

If method step $S_2$ is implemented, it can be followed by method step $S_3$. In method step $S_3$, in the event of a parameter change by the control unit 9, only the last value for the corresponding parameter is registered, and a control command is generated by the control unit 9 only to adjust this value for the parameter. As a result, the required memory space for the control commands is further reduced. Moreover, the adjustment of the measuring device 1 is implemented significantly more quickly, because it is no longer necessary for all values of the respectively adjusted parameter to be reset, but only the last value for each parameter is adjusted. However, method step $S_3$ is implemented as an option after method step $S_2$.

Method step $S_4$ can be implemented as an option after method step $S_1$ or method step $S_2$ and/or $S_3$. In method step $S_4$, parameter dependencies are taken into consideration in the generation of the control commands by the control unit 9, and/or the control commands are generated by the control unit 9 in chronological order. Taking parameter dependencies into consideration is particularly important if the control unit 9 generates control commands only for parameter changes. Accordingly, in order to implement given control commands, it is very often necessary for other parameters to provide a given value. The control unit 9 according to the invention preferably indicates these parameter dependencies; however, it can also generate corresponding control commands for the adjustment of the other necessary parameters. It is also important that the control commands are generated by the control unit 9 in chronological order. For example, in the case of measuring devices 1 which output signal with a specified power, this ensures that the signal is only output when the other parameters have been adjusted according to the specifications.

Method step $S_5$ is implemented after method step $S_1$ or method step $S_2$ and/or $S_3$ or after method step $S_4$. In method step $S_5$, the control commands are buffered in the at least one memory unit 8 and/or displayed on a visual-display unit 2 connected to the measuring device 1 and/or transmitted to a computer system connected to the measuring device 1 or respectively buffered there. All of this is implemented by the control unit 9. The control commands generated can then be used to generate a sequence of control commands from them with which the measuring device 1 can be controlled remotely.

Figure 4B:
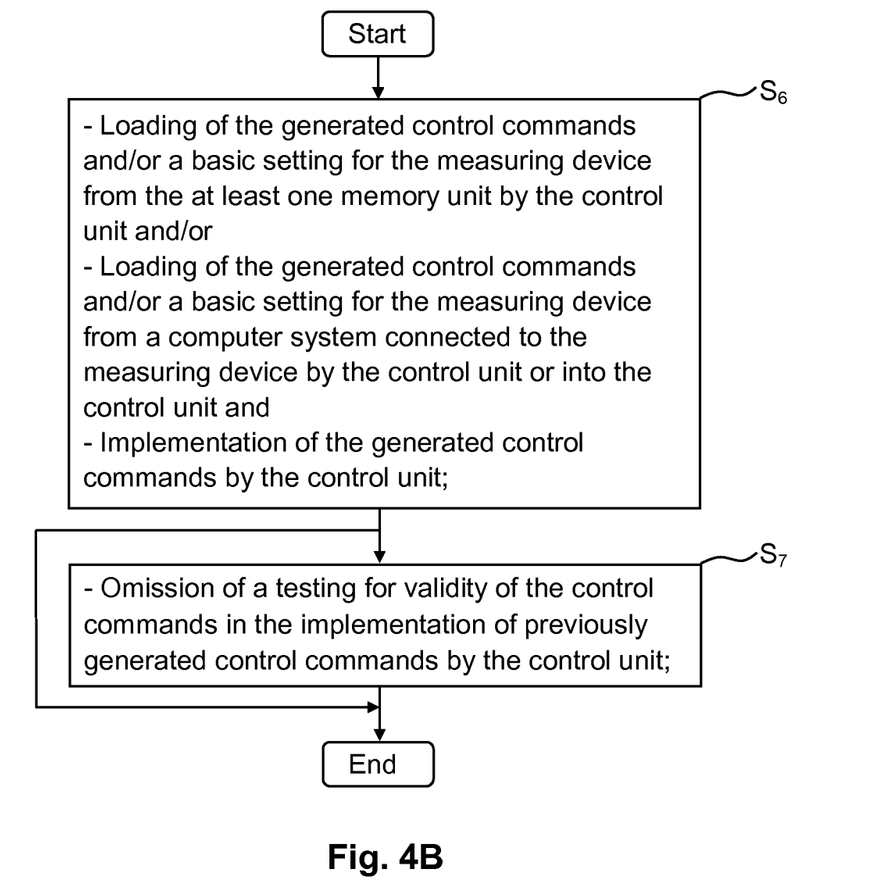
FIG. 4B shows a further exemplary embodiment of a flowchart of the method according to the invention for operating a measuring device.

FIG. 4B shows a further exemplary embodiment of a flowchart of the method according to the invention for operating a measuring device 1. Method step $S_6$, which can be implemented when corresponding control commands for adjusting parameters for the measuring device 1 have already been prepared by the control unit 9, is shown. In method step $S_6$, the generated control commands and/or a basic setting for the measuring device 1 are loaded by the control unit 9 from the at least one memory unit 8 and/or from a computer system connected to the measuring device 1. A basic setting is loaded, especially if control commands, which have been generated according to method step $S_1$, are to be loaded subsequently. Loading the generated control commands from a computer system connected to the measuring device 1 implies that the generated control commands can also be transmitted from precisely this computer system to the measuring device 1; that is to say, that the transmission procedure is initiated by a computer system. The basic setting loaded can be a previously prepared, buffered image. However, the basic setting can also comprise a plurality of control commands, which are combined to form a sequence and are implemented one after the other. Following this, the previously generated control commands are implemented by the control unit 9, so that the settings at the time of generating the control commands are loaded for the measuring device 1. Optionally, method step $S_7$ can also be implemented after method step $S_6$. In method step $S_7$, during the implementation of the previously generated control commands, a testing of the validity of the control commands by the control unit 9 is omitted. This can occur, for example, as shown in FIG. 3B, by communicating a given control instruction before the generated control commands. Method step $S_7$ is then preferably implemented if the loaded control commands have been generated according to method step $S_1$.

By preference, the measuring device 1 according to the invention with the control unit 9 and the method for operating the measuring device 1 according to the invention with the control unit 9 allows the measuring device 1 according to the invention to be remotely controlled. This is achieved, in particular, in that control commands are present in plain text and that the control commands are SCPI commands or VISA commands, which can be transmitted with known programs to the measuring device 1 according to the invention.

Within the framework of the invention, all of the features described and/or illustrated can be combined with one another as required. In particular, the dependent claims relating to the method can also be combined with the device claims relating to the measuring device 1 and vice versa. In particular, it is also possible to generate the corresponding control commands directly for all of the adjustable parameters of the measuring device 1.

What is claimed is:

1. A measuring device comprising:
a signal generator,
a central data-processing unit, a control unit and at least one memory unit,
wherein the control unit and the at least one memory unit are connected to the central data-processing unit,
wherein, at a given time, the control unit compares parameters to be adjusted in the measuring device with parameter values for a basic setting of the measuring device,
wherein, from a given time, the control unit registers parameter value changes between parameter values for the basic setting of the measuring device and parameter values to be adjusted in the measuring device, and generates control commands for parameters with registered parameter value changes in order to adjust parameters with the parameter values to be adjusted,
wherein the control unit generates control commands for parameters which are dependent from the parameters with registered parameter value changes, whereby the control commands for the dependent parameters are linked with control commands for the parameters with registered parameter value changes, and
wherein the control unit buffers the control commands in a chronological order to ensure that an output of the signal generator is activated only when a value for a level of a signal to be output has been set.

2. The measuring device according to claim 1,
wherein, in the case of a parameter change, the control unit registers only the last value for each parameter and generates a control command only for this in order to adjust it.

3. The measuring device according to claim 2,
wherein the control unit buffers the control commands in the at least one memory unit and/or
wherein the control unit displays the control commands on a visual-display unit connected to the measuring device and/or
wherein the control unit communicates the control commands to a computer system connected to the measuring device.

4. The measuring device according to claim 1,
wherein the control unit buffers the control commands in the at least one memory unit and/or wherein the control unit displays the control commands on a visual-display unit connected to the measuring device and/or wherein the control unit communicates the control commands to a computer system connected to the measuring device.

5. The measuring device according to claim 1,
wherein the control unit loads the generated control commands and/or a basic setting for the measuring device from the at least one memory unit and/or wherein the control unit loads the generated control commands and/or a basic setting for the measuring device from a computer system connected to the measuring device and/or that these are loadable from a computer system connected to the measuring device and wherein the control unit implements the generated control commands.

6. The measuring device according to claim 5,
wherein, in the implementation of previously generated control commands by the control unit, no testing of validity of the control commands takes place.

7. The measuring device according to claim 1,
wherein the generated control commands are buffered as plain text and/or wherein the generated control commands can be transmitted to the measuring device via a LAN bus and/or via a USB bus and/or via a CAN bus as standard commands for programmable instruments and/or virtual instrument software architecture commands, so that the measuring device can be controlled remotely.

8. A method for operating a measuring device including a signal generator, a central data-processing unit, a control unit and at least one memory unit, wherein the control unit and the at least one memory unit are connected to the central data-processing unit, wherein the method comprises:

comparing, by the control unit at a given time, parameter values to be adjusted in the measuring device with parameter values for a basic setting of the measuring device;

registering, by the control unit, parameter value changes between parameter values for the basic setting of the measuring device and parameter values to be adjusted in the measuring device from a given time;

generating control commands, by the control unit, for adjustment of parameters, for which parameter value changes are determined, with the parameter values to be adjusted;

linking control commands for the parameters with registered parameter value changes with control commands for parameters which are dependent from the parameters with registered parameter value changes; and buffering, by the control unit, the control commands in a chronological order to ensure that an output of the signal generator is activated only when a value for a level of a signal to be output has been set.

9. The method according to claim 8, further comprising the following method steps:

in the case of a parameter change, registering only the last value for every parameter, and generating, by the control unit, the control command for the adjustment of this value.

10. The method according to claim 9, further comprising the following method steps:

buffering of the control commands by the control unit in the at least one memory unit and/or displaying the control commands by the control unit on a visual-display unit connected to the measuring device and/or communicating the control commands by the control unit to a computer system connected to the measuring device.

11. The method according to claim 8, further comprising the following method steps:

buffering of the control commands by the control unit in the at least one memory unit and/or displaying the control commands by the control unit on a visual-display unit connected to the measuring device and/or communicating the control commands by the control unit to a computer system connected to the measuring device.

12. The method according to claim 8, further comprising the following method steps:

loading of the generated control commands and/or a basic setting for the measuring device by the control unit from the at least one memory unit and/or loading of the generated control commands and/or a basic setting for the measuring device into the control unit from a computer system connected to the measuring device and implementing the generated control commands by the control unit.

13. The method according to claim 12, further comprising the following method step:

in the implementation by the control unit of previously generated control commands, omitting a testing of validity of the control commands.

14. The method according to claim 8,
wherein the generated control commands are buffered as plain text; and/or wherein the measuring device is remotely controlled by transmitting the generated control commands to the measuring device via a LAN bus and/or a USB bus and/or a CAN bus as SCPI (standard commands for programmable instruments) and/or VISA (virtual instrument software architecture) commands.

15. A computer program with program-code, embedded in a non-transitory computer readable medium, for implementing all of the steps according to claim 8 when the program is executed on a computer or digital signal processor.

16. A computer software product with program-code, especially stored on a non-transitory machine-readable carrier, for implementing all of the steps according to claim 8 when the program is executed on a computer or digital signal processor.

* * * * *